United States Patent
Basker et al.

(10) Patent No.: US 10,283,586 B2
(45) Date of Patent: May 7, 2019

(54) CAPACITORS

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Christopher J. Penny, Saratoga Springs, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/059,807

(22) Filed: Mar. 3, 2016

(65) Prior Publication Data

US 2016/0365314 A1    Dec. 15, 2016

Related U.S. Application Data

(62) Division of application No. 14/736,881, filed on Jun. 11, 2015, now Pat. No. 9,607,943.

(51) Int. Cl.
*H01L 23/522* (2006.01)
*H01L 49/02* (2006.01)
(Continued)

(52) U.S. Cl.
CPC ........ *H01L 28/88* (2013.01); *H01L 21/31116* (2013.01); *H01L 21/7682* (2013.01);
(Continued)

(58) Field of Classification Search
CPC ........ H01L 28/60; H01L 28/82; H01L 28/90; H01L 29/945; H01L 28/40;
(Continued)

(56) References Cited

U.S. PATENT DOCUMENTS 5,792,706 A * 8/1998 Michael .............. H01L 21/7682
257/E21.581
6,492,245 B1    12/2002 Liu et al.
(Continued)

FOREIGN PATENT DOCUMENTS

JP    63299157    6/1988

OTHER PUBLICATIONS

Specification "CAPACITORS" and Drawings in related U.S. Appl. No. 14/736,881, filed Jun. 15, 2015, 17 pages.
(Continued)

*Primary Examiner* — Matthew L Reames
*Assistant Examiner* — John A Bodnar
(74) *Attorney, Agent, or Firm* — Steven J. Meyers; Andrew M. Calderon; Roberts Mlotkowski Safran Cole & Calderon, P.C.

(57) ABSTRACT

Back end of the line (BEOL) capacitors and methods of manufacture are provided. The method includes forming wiring lines on a substrate, with spacing between adjacent wiring lines. The method further includes forming an air gap within spacing between the adjacent wiring lines by deposition of a capping material. The method further includes opening the air gap between selected adjacent wiring lines. The method further includes depositing conductive material within the opened air gap.

18 Claims, 3 Drawing Sheets

(51) Int. Cl.
*H01L 23/528* (2006.01)
*H01L 23/532* (2006.01)
*H01L 21/768* (2006.01)
*H01L 21/311* (2006.01)

(52) U.S. Cl.
CPC .. *H01L 21/76802* (2013.01); *H01L 21/76834* (2013.01); *H01L 21/76877* (2013.01); *H01L 23/528* (2013.01); *H01L 23/5222* (2013.01); *H01L 23/5223* (2013.01); *H01L 23/53228* (2013.01); *H01L 28/60* (2013.01); *H01L 28/82* (2013.01)

(58) Field of Classification Search
CPC ............ H01L 23/5223; H01L 23/5222; H01L 21/7682; H01L 21/76837; H01L 21/76834
See application file for complete search history.

(56) References Cited

U.S. PATENT DOCUMENTS

| | | | |
|---|---|---|---|
| 6,498,069 B1 | 12/2002 | Grivna | |
| 7,166,902 B1 | 1/2007 | Badrieh et al. | |
| 8,053,865 B2 | 11/2011 | Chang et al. | |
| 8,765,547 B2 | 7/2014 | Farmer et al. | |
| 9,607,943 B2 | 3/2017 | Basker et al. | |
| 2002/0036309 A1 | 3/2002 | Sekiguchi et al. | |
| 2003/0073282 A1* | 4/2003 | Ning .................. | H01L 23/5223 438/243 |
| 2003/0170954 A1 | 9/2003 | Rudeck | |
| 2004/0124446 A1* | 7/2004 | Borger ................ | H01L 21/0214 257/276 |
| 2005/0029521 A1 | 2/2005 | Yamasaki et al. | |
| 2006/0024899 A1* | 2/2006 | Crenshaw ........... | H01L 23/5223 438/381 |
| 2006/0089001 A1 | 4/2006 | Erickson et al. | |
| 2008/0158771 A1* | 7/2008 | Chinthakindi ......... | H01G 4/005 361/301.4 |
| 2008/0171432 A1 | 7/2008 | Clevenger et al. | |
| 2009/0081873 A1 | 3/2009 | Park et al. | |
| 2009/0203192 A1* | 8/2009 | Kaltalioglu ....... | H01L 21/31116 438/462 |
| 2009/0224359 A1* | 9/2009 | Chang .................. | H01L 23/5223 257/522 |
| 2010/0123213 A1 | 5/2010 | Chen et al. | |
| 2011/0156209 A1 | 6/2011 | Williams et al. | |
| 2013/0001746 A1 | 1/2013 | Edwards | |
| 2013/0075823 A1 | 3/2013 | Yu et al. | |
| 2013/0320459 A1* | 12/2013 | Shue ................ | H01L 21/76283 257/392 |
| 2014/0001633 A1 | 1/2014 | Huang et al. | |
| 2015/0061069 A1* | 3/2015 | Friedrich ................ | H01L 28/91 257/506 |
| 2015/0145103 A1* | 5/2015 | Chou ...................... | H01L 28/92 257/534 |
| 2015/0187699 A1* | 7/2015 | Baek ................. | H01L 23/53223 257/773 |
| 2015/0340427 A1* | 11/2015 | Nagai ..................... | H01L 28/90 257/532 |

OTHER PUBLICATIONS

Office Action in the related U.S. Appl. No. 14/736,881, dated Apr. 21, 2016, 12 pages.
Notice of Allowance in related U.S. Appl. No. 14/736,881 dated Nov. 3, 2016, 9 pages.
"List of IBM Patents or Patent Applications Treated as Related" 1 page.
Specification "CAPACITORS" and Drawings U.S. Appl. No. 15/417,932, filed Mar. 3, 2017, 15 pages.
Office Action from U.S. Appl. No. 15/417,932 dated Sep. 22, 2017. 10 pages.
Office Action from U.S. Appl. No. 15/417,932 dated May 18, 2018, 13 pages.
Notice of Allowance from U.S. Appl. No. 15/417,932 dated Sep. 13, 2018, 8 pages.

* cited by examiner

C# CAPACITORS

FIELD OF THE INVENTION

The invention relates to semiconductor structures and, more particularly, to back end of the line (BEOL) capacitors and methods of manufacture.

BACKGROUND

Vertical natural capacitors are on-chip capacitors that are incorporated into the interconnect levels of integrated circuits, typically during back end of line (BEOL) processes. Such capacitors are currently used as capacitor devices in many logic and analog semiconductor technologies. These capacitors may be placed in close proximity to various components on the integrated circuit in order to minimize inductive or resistive losses that may occur when using off-chip capacitors. As technology scaling continues, the capacitance density for such capacitors is expected to increase; however, the circuit density increases, the capacitance tends to drop.

SUMMARY

In an aspect of the invention, a method comprises forming wiring lines on a substrate, with spacing between adjacent wiring lines. The method further comprises forming an air gap within spacing between the adjacent wiring lines by deposition of a capping material. The method further comprises opening the air gap between selected adjacent wiring lines. The method further comprises depositing conductive material within the opened air gap.

In an aspect of the invention, a method comprises forming wiring lines on a substrate, with spacing between adjacent wiring lines. The method further comprises forming an air gap within the spacing by depositing capping material on the wiring lines and within the spacing between the adjacent wiring until the capping material becomes pinched off. The method further comprises forming a dielectric material over the capping material including over the air gaps. The method further comprises forming a trench in the dielectric material over the air gaps. The method further comprises removing a bottom surface of the trench and underlying capping material to open the air gaps. The method further comprises depositing conductive material within the trench and within the opened air gaps.

In an aspect of the invention, a back end of line capacitor comprises: a bottom plate comprising a plurality of metal lines separated by spacing; a dielectric layer lining the metal lines within the spacing; and a top plate above the metal lines and within the spacing over the dielectric material.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to back end of the line (BEOL) capacitors and methods of manufacture. More specifically, the present invention is directed to a BEOL plate capacitor and methods of manufacturing using copper etch back and air gap processes. In embodiments, the capacitor can also be a comb pattern of wider or narrower lines. Moreover, the capacitor can land on a prior airgap level, and the lines could be perpendicular to the gaps below. Advantageously, the BEOL capacitor described herein allows for device scaling accompanied by increased capacitance density. In further embodiments, the BEOL capacitor can be used with ultra low dielectric constantmaterials while still allowing for device scaling and accompanied by increased capacitance density (over conventional structures). In embodiments, the BEOL capacitor is a vertical natural capacitor.

The capacitor of the present invention can be manufactured in a number of ways using a number of different tools. In general, though, the methodologies and tools are used to form structures with dimensions in the micrometer and nanometer scale. The methodologies, i.e., technologies, employed to manufacture the plate capacitor of the present invention have been adopted from integrated circuit (IC) technology. For example, the structures of the present invention are built on wafers and are realized in films of material patterned by photolithographic processes on the top of a wafer. In particular, the fabrication of the plate capacitor of the present invention uses three basic building blocks: (i) deposition of thin films of material on a substrate, (ii) applying a patterned mask on top of the films by photolithographic imaging, and (iii) etching the films selectively to the mask.

Figure 1:
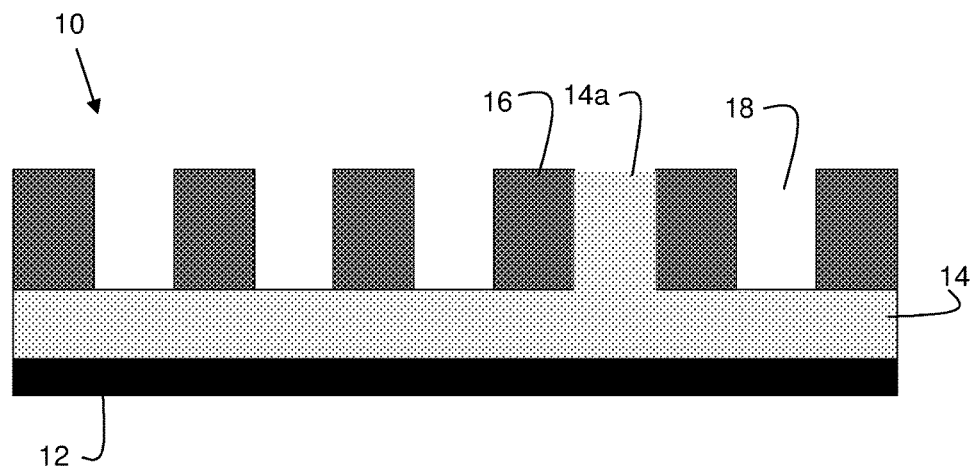
FIG. 1 shows a starting structure and respective fabrication processes in accordance with aspects of the invention.

FIG. 1 shows a starting structure and respective fabrication processes in accordance with aspects of the invention. The starting structure 10 is a BEOL structure which includes an etch stop layer 12. The etch stop layer 12 protects lower wiring and device layers from BEOL processes, as well as acting as a barrier diffusion layer for copper or other metals. In embodiments, the etch stop layer 12 can be a nitride layer, SiN or SiNC (NBLOK) or bilayer-like films with silicon oxy nitride (as a $2^{nd}$ layer) or other etch stop material for the upper via level.

An insulator layer 14 is formed on the layer 12. In embodiments, the insulator layer 14 can be an ultra low dielectric material, e.g., k<2.2; although other insulator materials are contemplated by the present invention. In embodiments, the insulator layer 14 can be fluorinated silica glass, carbon-doped silicon dioxide, porous silicon dioxide or spin-on organic polymeric dielectrics as examples. The insulator layer 14 can be deposited using conventional chemical vapor deposition (CVD) or plasma enhanced CVD (PECVD) processes, as examples.

Still referring to FIG. 1, a plurality of metal lines 16 are formed with spacing 18 therebetween. In embodiments, the metal lines 16 have equal line spacing 18 therebetween; although other spacing is contemplated by the present invention based on technology nodes and other design criteria. For example, the width of the metal lines 16 can be larger than the spacing 18. In any scenario, in embodiments, the metal lines 16 can be copper material forming wires or vias; although other metal or metal alloy material is also contemplated by the present invention.

The metal lines 16 can be formed using conventional damascene processes. For example, in embodiments, the insulator layer 14 can be patterned using conventional lithography and etching processes, e.g., reactive ion etching (RIE), to form openings. Conductive material, e.g., copper, can be deposited within the openings, following by a chemical mechanical polishing to planarize the metal layer and remove any residual metal material from a surface of the insulator material. The conductive material can be deposited using conventional CVD or PECVD processes, amongst other deposition processes.

The insulator material between the metal lines 16 can be removed using conventional dry etching processes, e.g., RIE, to form the spacing 18 between the metal lines 16. In embodiments, insulator material 14a can remain between selected metal lines 16 in order to provide rigidity and maintain the integrity of the structure. For example, the insulator material 14a can be aligned with an upper via or located at a position that is devoid of any critical features.

Figure 2:
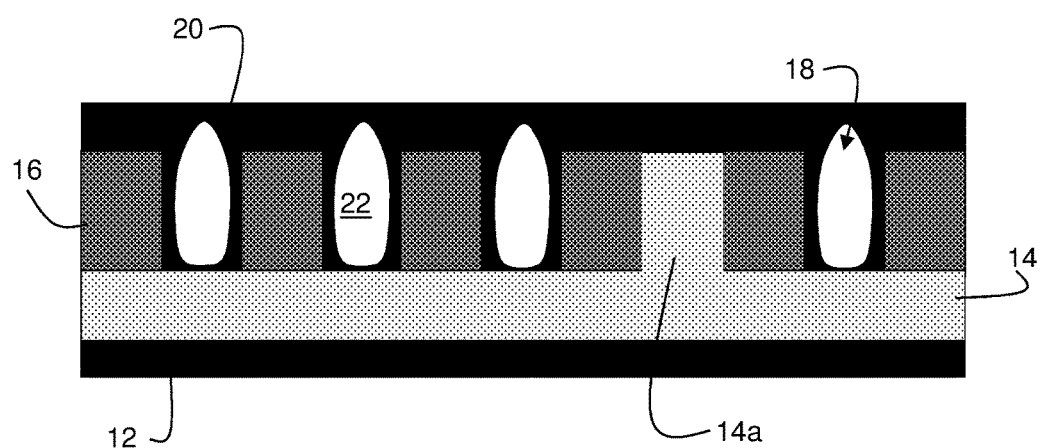
FIG. 2 shows formation of air gaps between metal lines and respective fabrication processes in accordance with aspects of the invention.

FIG. 2 shows formation of air gaps 22 between metal lines 16 and respective fabrication processes in accordance with aspects of the invention. More specifically, as shown in FIG. 2, a capping material 20 is formed over the metal lines 16 and within the spacing 18. The capping layer 20 can be deposited using a conventional CVD, PECVD or other deposition process. During the deposition process, the capping layer 20 will line the sidewalls of the metal lines 16, following by pinching off the spacing 18 forming the air gaps 22. That is, the capping layer 20 will be pinched off prior to completely filling the spacing 18, thereby resulting in capping material on the sidewalls of the metal lines and an air gap 22 within the spacing 18. The deposition process will continue until the capping material 20 forms a layer over the metal lines 16 and any insulator material 14a. The capping material 20 can optionally be planarized using a conventional CMP process. In embodiments, the capping material 20 can be nitride of other NBLOK material or other diffusion barrier material.

Figure 3:
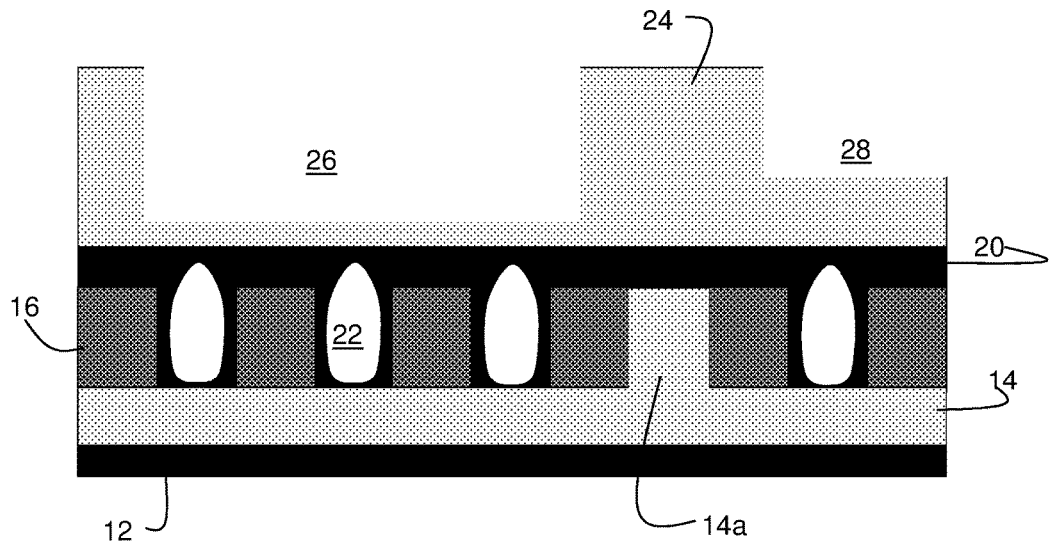
FIG. 3 shows offset trenches and respective fabrication processes in accordance with aspects of the invention.

In FIG. 3, an insulator material 24 is deposited on the capping material 20. In embodiments, the insulator material 24 can be an ultra low dielectric material, e.g., k<2.2; although other insulator aterials are also contemplated by the present invention as described herein. The insulator material 24 can be patterned to form trenches 26 and 28 using conventional lithography and etching processes as described herein. In embodiments, the trenches 26 and 28 have offset depths, e.g., trench 26 is deeper than the trench 28. In this way, the trench 26 will forth part of a deep plate capacitor structure; whereas, the trench 28 will form a conventional interconnection structure, as an example.

In embodiments, the trenches 26 and 28 are formed using conventional lithography and etching (RIE) processes. For example, the trench 28 can be formed by first punching through a TiN hardmask to etch an initial depth in the insulator material. Thereafter, both trenches 26 and 28 undergo a RIE process to form the respective depths of the trenches 26 and 28. Iii alternative embodiments, the deeper trench 26 can be formed by an engineered reverse RIE lag process which results in a deeper trench due its larger cross sectional area (compared to the trench 28). After trench formation,any remaining masking material can be removed using an oxygen ashing process or other conventional stripping technique.

Figure 4:
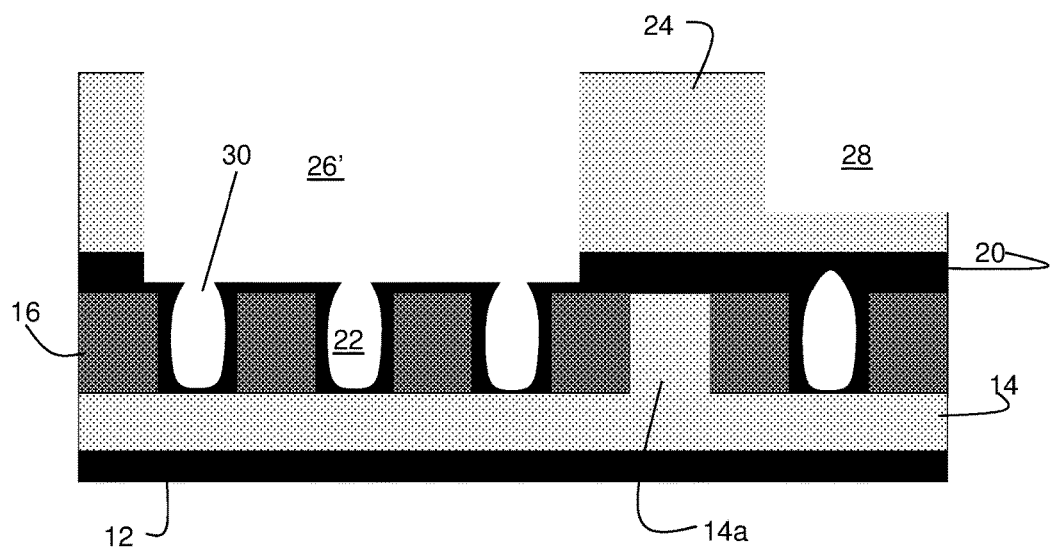
FIG. 4 shows an opening to the air gap from a trench and respective fabrication processes in accordance with aspects of the invention.

FIG. 4 shows a process to open the air gaps 22 in accordance with aspects of the present invention. By way of illustration, an etching process can be used to provide an opening 30 to the air gaps 22, by making the trench aligned with the air gaps 22 deeper as shown by reference numeral 26'. The etching process will also remove insulator material 24 from the bottom of the trench 28; however, this etching process will not open the underlying air gap(s) since trench 28 was not as deep as original trench 26.

Figure 5:
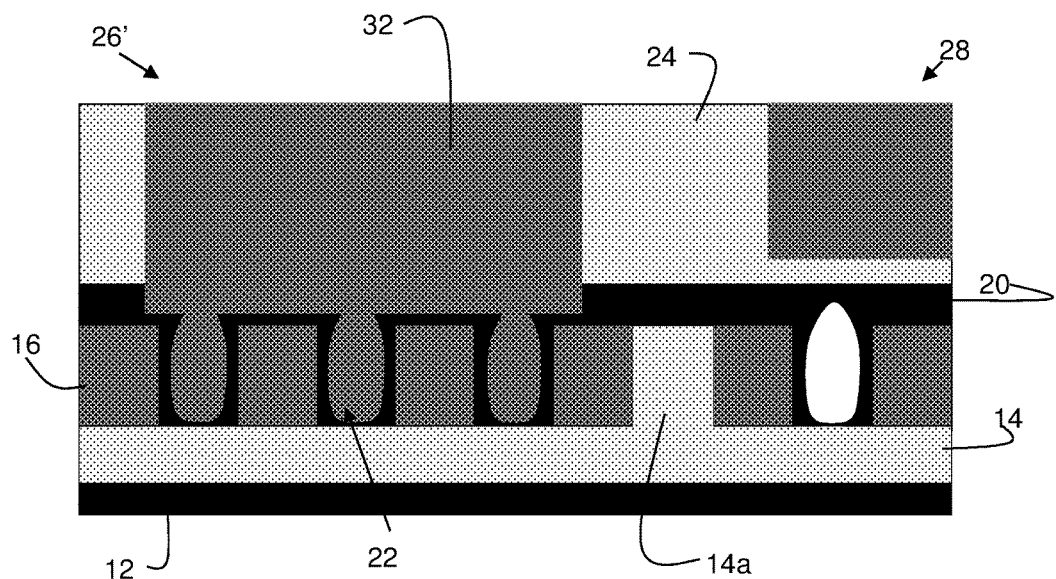
FIG. 5 shows a metal fill within the air gap and the plurality of trenches and respective fabrication processes in accordance with aspects of the invention.

In FIG. 5, a conductive material 32 is deposited within the trenches 26', 28, as well as within the opened air gaps 22 (and overlying the adjacent pair of bottom metal lines). In embodiments, the conductive material 32 can be copper or other metal or metal alloy deposited using any conventional deposition process such as CVD, PECVD or an atomic layer deposition (ALD). The deposition process can be followed by a reflow of the metal material 32 to ensure adequate coverage within the air gaps 22.

The conductive material 32 within the air gaps 22 can be used as grounds for a capacitor plate which comprises the metal lines 16, capping material 20 on the sidewalls of the metal lines 16, and the metal material 32. The capacitance of the structure can be set by adjusting the thickness and/or dielectric of the capping material 20 on the sidewalls of the metal lines 16.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A back end of line capacitor comprising:
a bottom plate comprising a plurality of separate metal lines separated by spacing;
a dielectric layer lining the separate metal lines within the spacing;
an insulator material on an contacting an upper surface of the dielectric layer; and
a top plate above the separate metal lines and within the spacing over the dielectric layer, wherein the top plate is within a trench in the insulator material and a trench in the dielectric layer, wherein the plurality of separate metal lines are on an insulator layer, and further comprising:
a first other metal line on the insulator layer, wherein a portion of the insulator layer extends between and contacts sidewalls of the first other metal line and one of the plurality of separate metal lines;
a second other metal line on the insulator layer, wherein the dielectric layer encloses an air gap in a spacing between the first other metal line and the second other metal line.

2. The back end of line capacitor of claim 1, wherein the dielectric layer comprises a planarized surface.

3. The back end of line capacitor of claim 1, wherein the dielectric layer is nitride material.

4. The back end of line capacitor of claim 1, wherein the insulator material is an ultra low dielectric material.

5. The back end of line capacitor of claim 1, further comprising another trench in the insulator material separated from the top plate by a portion of the insulator material.

6. The back end of line capacitor of claim 5, wherein the trench and the other trench have offset depths.

7. The back end of line capacitor of claim 6, wherein the top plate is provided over the spacing between the separate metal lines of the bottom plate.

8. The back end of line capacitor of claim 7, wherein the top plate is provided within the spacing between the plurality of separate metal lines of the bottom plate, and separated from the plurality of separate metal lines of the bottom plate by the dielectric layer.

9. The back end of line capacitor of claim 8, wherein the top plate provided within the spacing is formed in an airgap that has an opened upper portion.

10. The back end of line capacitor of claim 1, wherein the dielectric layer is above the plurality of separate metal lines.

11. The back end of line capacitor of claim 1, wherein the dielectric layer is one of nitride, NBLOK material, and a diffusion barrier metal.

12. The back end of line capacitor of claim 1, wherein the top plate is surrounded by the insulating material at sidewalls of the top plate.

13. The back end of line capacitor of claim 1, wherein a width of the separate metal lines is larger than the width of the spacing.

14. The back end of line capacitor of claim 5, further comprising a conductive material in the other trench.

15. The back end of line capacitor of claim 14, wherein:
the insulator material contacts sidewalls of the top plate; and
the insulator material contacts sidewalls and a bottom surface of the conductive material.

16. The back end of line capacitor of claim 14, wherein a bottom surface of the conductive material is vertically offset from a bottom surface of the top plate.

17. The back end of line capacitor of claim 14, wherein:
a bottom surface of the top plate is vertically below a top surface of the dielectric layer; and
a bottom surface of the conductive material is vertically above the top surface of the dielectric layer.

18. The back end of line capacitor of claim 1, wherein the top plate comprises a conductive material that extends into gaps lined by the dielectric layer between respective ones of the plurality of separate metal lines.

* * * * *